United States Patent [19]

Hirono et al.

[11] Patent Number: 5,024,724
[45] Date of Patent: Jun. 18, 1991

[54] DRY-ETCHING METHOD

[75] Inventors: Yutaka Hirono; Seiichi Kiyama, both of Neyagawa; Masato Osumi, Osaka, all of Japan

[73] Assignee: Sanyo Electric Co., Ltd., Osaka, Japan

[21] Appl. No.: 423,535

[22] Filed: Oct. 16, 1989

Related U.S. Application Data

[63] Continuation of Ser. No. 172,381, Mar. 24, 1988, abandoned.

[30] Foreign Application Priority Data

Mar. 27, 1987 [JP] Japan .................................. 62-75368
Oct. 14, 1987 [JP] Japan .................................. 62-262224

[51] Int. Cl.$^5$ ............................. C23F 1/02; C23F 4/02
[52] U.S. Cl. ..................................... 156/643; 156/652; 156/656; 156/665; 156/628
[58] Field of Search ............... 156/628, 655, 665, 643, 156/646, 652, 656, 651, 659.1, 664, 667; 437/228, 935

[56] References Cited

U.S. PATENT DOCUMENTS

| | | | |
|---|---|---|---|
| 4,390,394 | 6/1983 | Mathuni et al. | 156/643 |
| 4,412,885 | 11/1983 | Wang et al. | 156/643 |
| 4,474,642 | 10/1984 | Nakane et al. | 156/643 |
| 4,490,210 | 12/1984 | Chen et al. | 156/643 |
| 4,505,782 | 3/1985 | Jacob et al. | 156/643 |
| 4,529,475 | 7/1985 | Okano et al. | 156/643 |
| 4,618,398 | 10/1986 | Nawata et al. | 156/643 |
| 4,622,095 | 11/1986 | Grobman et al. | 156/643 X |
| 4,834,834 | 5/1989 | Ehrlich et al. | 156/643 |

FOREIGN PATENT DOCUMENTS

| | | | |
|---|---|---|---|
| 56-90539 | 7/1981 | Japan | 156/643 |
| 57-161067 | 10/1982 | Japan | 156/643 |
| 59-86222 | 5/1984 | Japan . | |
| 60-187026 | 9/1985 | Japan . | |
| 6141132 | 9/1986 | Japan . | |

Primary Examiner—Kenneth M. Schor
Attorney, Agent, or Firm—Darby & Darby

[57] ABSTRACT

The present invention relates to a novel dry-etching method for patterning a metallic film, whose surface is provided with an oxidized film, into an optional configuration by the use of the oxidized film. After drawing etching patterns of the metallic film by irradiating energy beam to the oxidized film formed on the surface of the metallic film, the dry-etching method according to the present invention causes the metallic film to expose itself to either radicals of reactive gas or to etching gas, and then selectively removes the area of metallic film in correspondence to the beam irradiated area of the oxidized film by applying chemical etching, thus eventually allowing the metallic film to be patterned into an optional configuration, without incuring physical damage to the etching face of the metallic film.

16 Claims, 12 Drawing Sheets

DRY-ETCHING METHOD

This is a continuation of application Ser. No. 172,381, filed Mar. 24, 1988, now abandoned.

BACKGROUND OF THE INVENTION

1. Field of the Invention

The present invention relates to a dry-etching method for patterning metallic film made from aluminum for example into an optional configuration.

2. Description of the Prior Art

Dry etching processes are used against metallic electrode film and semiconductor film of a semiconductor. In particular, reflecting extremely severe requirements in conjunction with manufacture of integrated circuits into extremely fine configuration, it is essential for the manufacturers to implement plasma etching such as reactive ion etching for example. As was disclosed in the Japanese Patent Laid-Open No. 61-41132 (1986), while holding the objective material in reactive gas environment, plasma is first activated by radio-frequency discharge to generate a variety of ions and radicals before etching is eventually executed by multiple function of sputter effect generated by collision of ions and chemically reactive radicals.

Nevertheless, as mentioned above, since the plasma etching cannot be achieved merely by chemical reaction of radicals, but by multiple function of sputter effect generated by collision of ions, the plasma etching incurs physical damage to the surface of the etched object. If the etched object has minimal configuration like a semiconductor device, the adverse effect of physical damage cannot be ignored at all.

On the other hand, although it is considered that any conventional dry etching method directly irradiating focussed ion beams to the target portion of the etching object is quite promising, since this method also sputters the objective etching portion with focussed ion beams, the remaining portion of the etched surface unavoidably incurs certain physical damage.

SUMMARY OF THE INVENTION

The primary object of this invention is to overcome those problems mentioned above by providing a novel dry-etching method which securely prevents even the slightest physical damage from occurring on the surface of metallic film bared by etching process by first irradiating energy beams to oxidized film generated on the surface of metallic film to be etched, followed by application of chemical etching to the metallic film by exposing it to either radicals of reactive gas or to the etching gas.

The second object of the invention is to provide a novel dry-etching method which dispenses with masking material for executing chemical etching by virtue of the function of oxidized film which serves as etching-resistant mask when applying chemical etching to the metallic film.

The third object of the invention is to provide a novel dry-etching method which securely accelerates the velocity of executing etching process by chemically etching the metallic film by exposing it to etching gas.

The fourth object of the invention is to provide a novel dry-etching method which is capable of chemically dry-etching a plurality of specimens continuously by executing irradiation of energy beams and chemical etching discretely in separate rooms.

The above and further objects and features of the invention will more fully be apparent from the following detailed description with accompanying drawings.

DESCRIPTION OF THE PREFERRED EMBODIMENTS

Referring now more particularly to the accompanying drawings, preferred embodiments of the dry-etching method related to the invention are described below.

Figure 1:
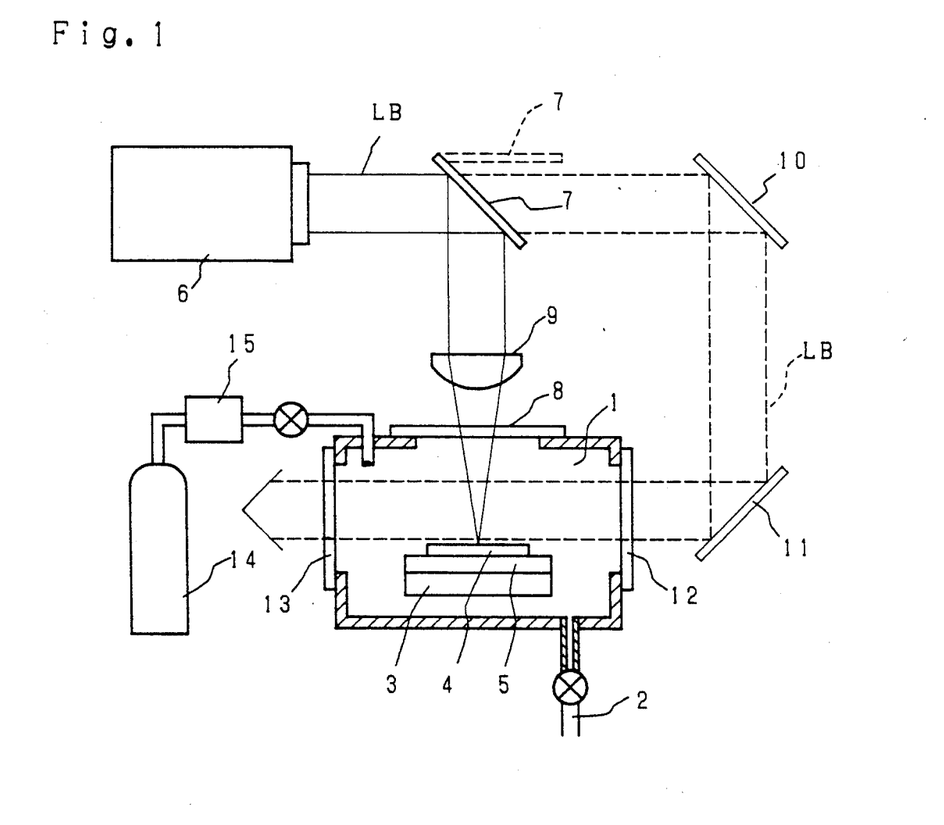
FIG. 1 is the schematic diagram of the apparatus embodying the first preferred embodiment of the dry-etching method related to the invention.

First, the first preferred embodiment, i.e., the method for removing patterns of metallic film by using radicals of reactive gas is described below. FIG. 1 is the schematic diagram of the apparatus implementing the first preferred embodiment of the dry-etching method related to the invention. This apparatus incorporates the following constituents: Reactive chamber 1 which decompresses atmospheric pressure to a maximum of $10^{-3}$ Torr via vacuum means 2. Specimen holder 3 which holds the etching specimen 4 is installed to the center of the reactive chamber 1. Heater 5 which heats the etching specimen 4 to the predetermined temperature is mounted on the surface of the specimen holder 3. The first beam-permeation window 8 is set to the ceiling of the reactive chamber 1. The second beam-permeation window 12 and a beam-outgoing window 13 are respectively set to the side-walls of the reactive chamber 1 in the manner being opposite from each other.

The apparatus is also provided with pulse-output type ArF excimer laser 6 which emits ultraviolet rays like laser beams (LB) having 193 nm of wave length for example. The first mirror 7 which is movable in the forward and backward directions along the laser beam path is provided in the direction of laser beams emitted from the ArF excimer laser 6. Converging lens 9 is installed between the first mirror 7 and the first beam-permeation window 8 for converging laser beams. If the first mirror 7 is in the laser beam path, it shifts the path of laser beams emitted from the ArF excimer laser 6. This causes the converging lens 9 to focus laser beam diameter in order that the focussed laser beams can be provided with high-density energy, in other words, the focussed laser beams can be converted into convergence laser beams, which then permeate themselves through the first beam-permeation window 8 before eventually being irradiated to the surface of the etching specimen 4. The first mirror 7 is interrelated to X-Y table (not shown). In response to the scanning operation of the first mirror 7, the convergence laser beams are irradiated to the predetermined etching pattern area.

If the convergence laser beams are not spotty and a cylindrical lens is made available for making up the converging lens 9, then sheet-like (linear) convergence laser beams are generated before irradiating themselves over an extensive area all at once. As a result, unlike those spotty convergence laser beams, linearly convergence laser beams totally dispense with scanning operation of the first mirror 7 and can efficiently be irradiated to etching patterns covering an extensive region. Furthermore, when the ArF excimer laser 6 outputs a large amount of laser beams, a plurality of cylindrical lenses may be installed in parallel with each other to generate a plurality of linearly convergence laser beams from a single laser beam and simultaneously irradiate them to a plurality of etching pattern areas.

On the other hand, when the first mirror 7 is at a specific position behind the laser beam path (this position is indicated by broken line shown in FIG. 1), laser beams emitted from the ArF excimer laser 6 are reflected by the second and third mirrors 10 and 11, and then the reflected laser beams are led into the reactive chamber 1 from the second beam-permeation window 12 without being focussed, i.e., in the state of non-convergence laser beams. These laser beams then proceed themselves in parallel with each other over the surface of the etching specimen 4 without coming into contact with it. These laser beams are then emitted out of the beam-outgoing window 13 of the reactive chamber 1 before eventually being monitored by the beam-detecter (not shown).

Gas cylinder 14 storing BCl₃ is linked to the reactive chamber 1 via mass-flow controller 15. Gas cylinder 14 delivers reactive gas (BCl₃) to the reactive chamber 1, while the flow rate of the reactive gas is controlled by the mass-flow controller 15, and then, the reactive gas is activated by irradiation of either the convergence or the non-convergence laser beams.

Figure 2:
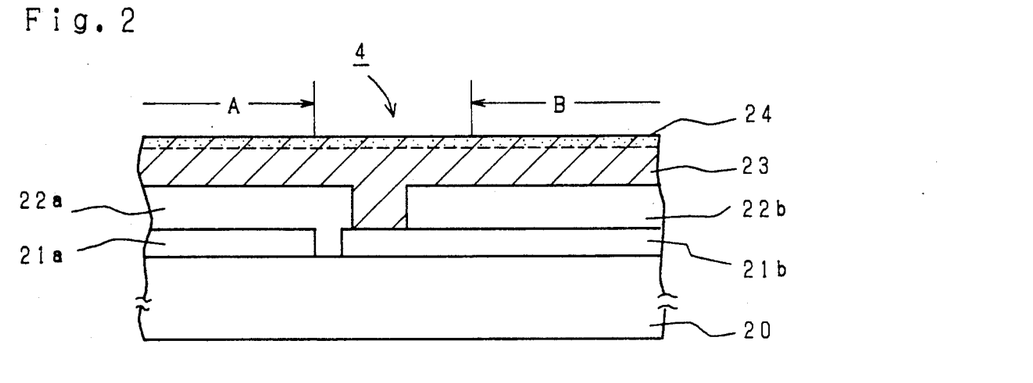
FIGS. 2 through 4 are respectively the enlarged sectional diagrams of essential parts of the etching object shown in accordance with the process conditions when executing the dry-etching method related to the invention.

In the next step, as shown in FIG. 2, semiconductor film 22a, 22b, each incorporating pins being connected to the film surface in parallel with each other are superimposed on transparent electrodes 21a, 21b, which are made from either indium tin oxide (ITO) or SnO₂ and separately disposed in a plurality of power-generating regions A, B, of glass substrate 20. Then, specimen 4 is finally prepared, whose entire surface of the layers comprised of transparent electrodes 21a, 21b, and semiconductor films 22a, 22b, is covered with aluminum film 23. Next, using the etching apparatus shown in FIG. 1, like the above layers, aluminum film 23 is split into a plurality of power-generating regions A, B, since aluminum is easily oxidized by atmospheric oxygen, normally, the surface of aluminum has a minimum of about 50 Å (angstrom) of oxidized film 24 made from Al₂O₃ without applying any particular treatment as shown in FIG. 2.

By effectively availing of oxidized film 24, the dry-etching method related to the invention embodies patterning of aluminum film 23 into an optional configuration. First, specimen 4 having oxidized film 24 made from Al₂O₃ on its surface is installed to the specimen holder 3 of the etching apparatus shown in FIG. 1. Then, the internal space of the reaction chamber 1 is retained in the decompresses state having a maximum of $10^{-3}$ torr of atmospheric pressure via vacuum means 2. Next, laser beams (LB) are emitted from the ArF excimer laser 6, which are then oriented to the converging lens 9 by the first mirror 7.

Figure 5:
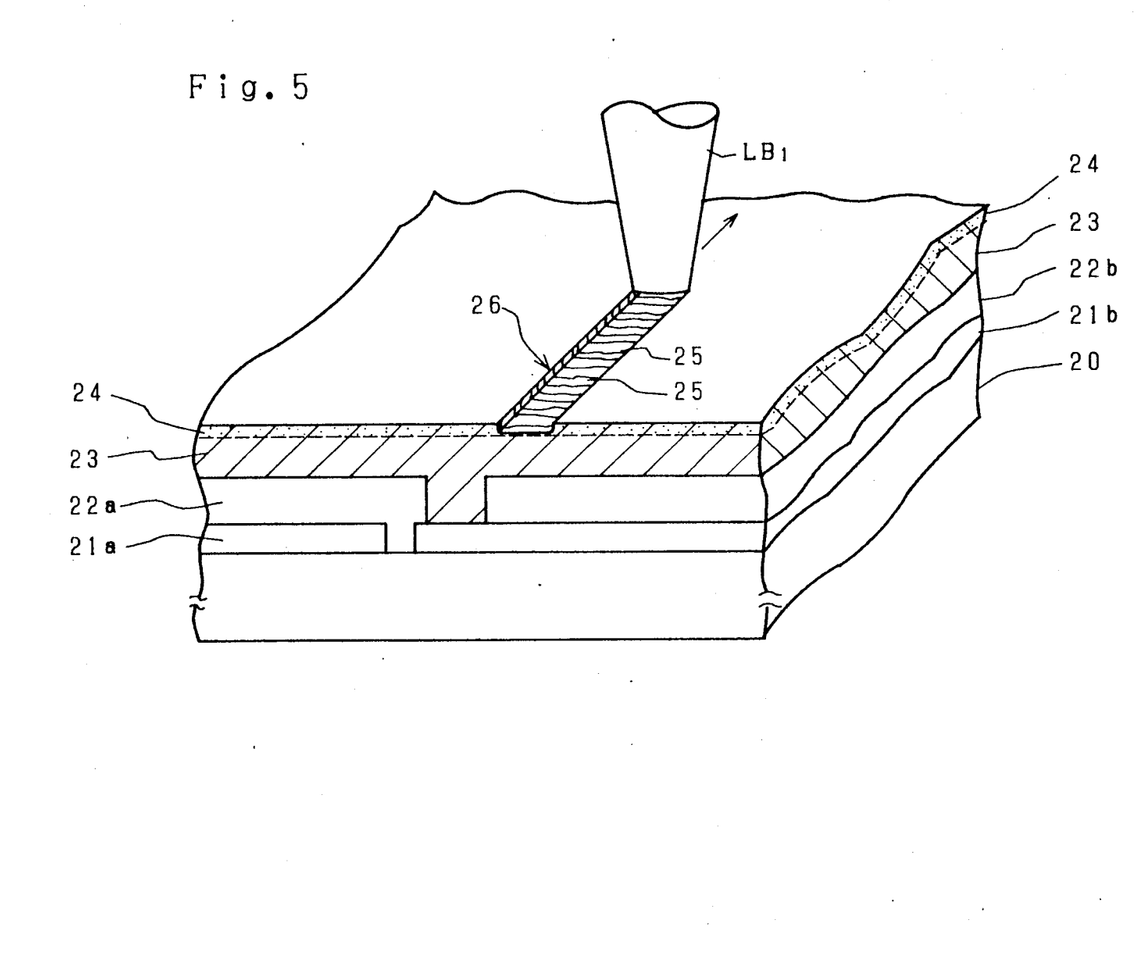
FIG. 5 is the perspective sectional view of essential parts of the etching object used for embodying the dry-etching method related to the invention.

Next, the first mirror 7 is scanned in order that the convergence laser beams (LB₁) can be irradiated to the preliminarily programmed portion. FIG. 5 denotes the partially enlarged specimen 4 scanned by laser beams (LB₁). The convergence laser beams which irradiate oxidized film 24, i.e., the surface of specimen 4 are substantially comprised of ultraviolet beams having 193 nm (nanometers) of wave length. Next, transmuted portion 26 is formed, which substantially contains a large number of cracks 25 each permeating oxidized film 24 having about 50 Å (angstrom) of thickness and reaching the lower aluminum film 23 to be etched. The transmuted portion 26 is formed at a specific portion of the oxidized film 24 that is subjected to irradiation of the convergence laser beams at 20 W/cm² of average irradiation power density having 10 nsec. (nanoseconds) of pulse width for 100 pulses.

Simultaneously, reactive gas composed of BCl₃ is fed into the reaction chamber 1 from the gas cylinder 14. When the internal pressure of the reaction chamber is retained at 20 Torr, BCl₃ is dissociated by ultraviolet beams having 193 nm of wave length in accordance with reactions shown below.

Cl*: Cl radical

On the other hand, removal of oxidized film 24 is promoted by the reaction shown below.

Consequently, if BCl₃ is delivered to the reaction chamber 1 simultaneous with the irradiation of the convergence laser beams, compared to the drawing of etching patterns merely by irradiating the convergence laser beams, a large number of cracks are generated by physical destruction. Since the removal of the transmuted portion 26 from the oxidized film 24 is chemically promoted, clear patterns can eventually be generated in contrast with aluminum film 23 to be etched.

Figure 3:
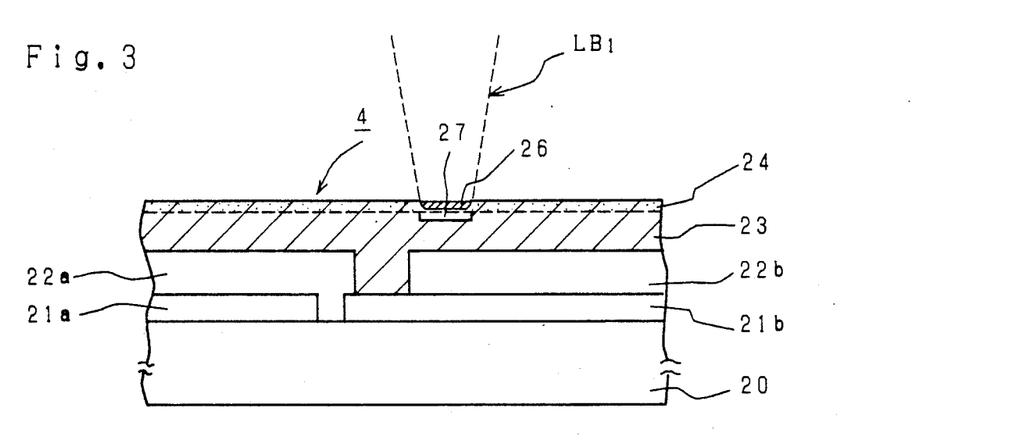
Figure 4:
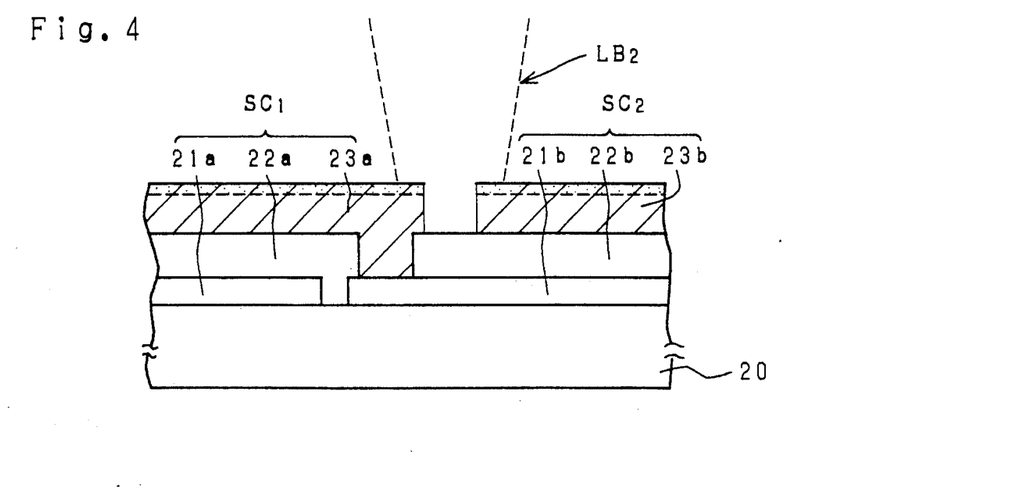

In this way mentioned above, the dry etching method related to the invention allows the etching apparatus to draw etching patterns of aluminum film 23 on the oxidized film 24 by irradiating the convergence laser beams (LB₁) to the surface of the oxidized film 24 via the scanning operation of the first mirror 7. After completing drawing of etching patterns using a number of cracks 25 joined together, the position of the first mirror 7 is lifted to the horizontal level as shown by broken line of FIG. 1. This causes the path of laser beams (LB) into the non-convergence beam path which is not provided with converging means interlinking the ArF excimer laser 6, the second mirror 10, the third mirror 11, the second beam-permeation window 12, internal space of the reaction chamber 1, and the beam-outgoing window 13. At the same time, reactive gas comprised of $BCl_3$ containing chlorine corroding aluminum film is fed into the reaction chamber 1 from the gas cylinder 14 so that the internal space of the reaction chamber 1 can be held at 20 Torr of pressure. When irradiating non-convergence laser beams (LB₂) containing 1 W/cm² of average irradiation power density directly or to a position close to the oxidized film 24 of the surface of the specimen 4 while maintaining the above condition, the reactive gas comprised of $BCl_3$ generates chemically active Cl radical which does not provide $Al_2O_3$ oxidized film 24 with etching effect and conversely provides aluminum film 23 with sufficient etching effect. Accordingly, when exposing the specimen 4 to the activated reactive gas environment containing Cl radical which generates substantial etching effect against aluminum film 23, Cl radical permeates the surface of the etching-applicable aluminum film 23 through cracks 25 generated by irradiation of the convergence laser beams without etching the oxidized film 24 at all, thus eventually allowing part of aluminum film 23 containing a number of cracks 25 on the surface to be removed. In other words, the oxidized film 24 serves as the etching-resistant mask. Next, as the selective etching goes on against aluminum film 23 as shown in FIG. 3, the bottom portion 27 of the transmuted portion 26 of the oxidized film 24 containing a number of cracks 25 in assembly becomes empty. As a result, the transmuted portion 26 collapses itself while the etching is underway, thus aluminum film 23 is split into power-generating regions A, B, which eventually become back-surface electrodes 23a, 23b, constituting photoelectric conversion films SC1, SC2, together with transparent electrodes 21a, 21b, and semiconductor films 22a, 22b.

The above-cited preferred embodiment switches the etching pattern drawing process using convergence laser beams and the etching process using non-convergence laser beams by shifting the position of the first mirror 7. However, if a half mirror is made available for making up the first mirror 7, then the etching pattern drawing process can be executed simultaneously.

Figure 6:
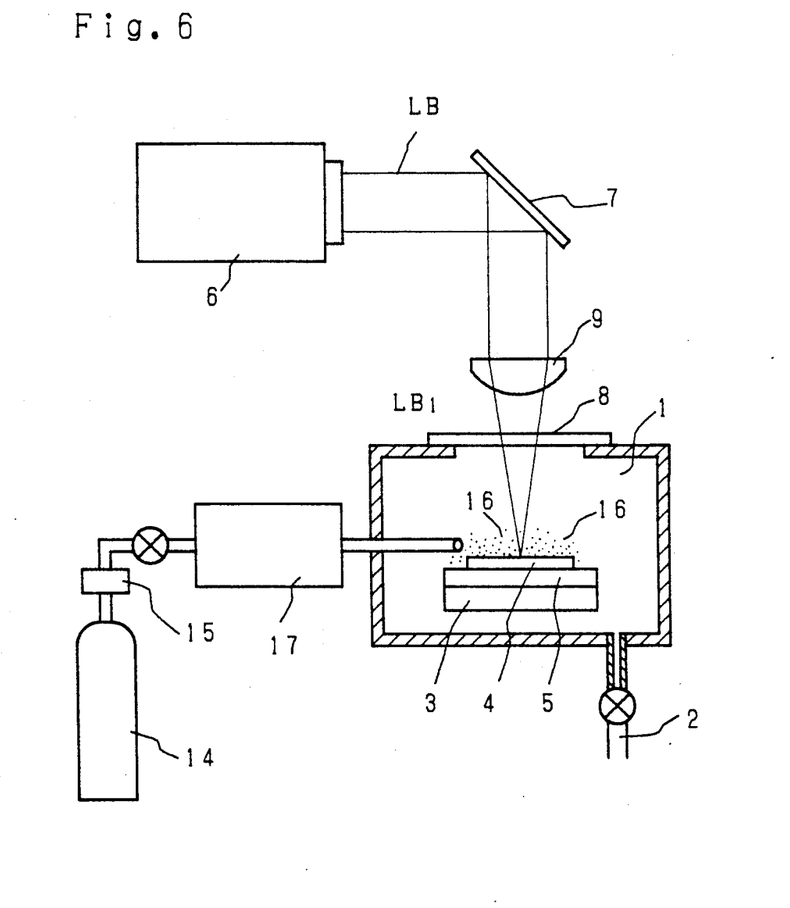
FIGS. 6 and 7 are respectively the schematic diagrams of other apparatuses used for embodying the first preferred embodiment of the dry-etching method related to the invention.

FIG. 6 denotes another apparatus for implementing the first preferred embodiment of the dry-etching method related to the invention. This apparatus is provided with the following constituents having the reference numerals identical to those of the etching apparatus shown in FIG. 1 including the reactive chamber 1, vacuum means 2, specimen holder 3, specimen 4, heater 5, ArF excimer laser 6, the first mirror 7, the first beam-permeation window 8, converging lens 9, gas cylinder 14, and mass-flow controller 15, respectively. Unlike the fore-going etching apparatus, this apparatus is additionally provided with radical generator 17 in a position close to the reaction chamber 1 for generating chemically active radicals 16, 16, needed for etching aluminum film 23 in order that only those radicals directly contributing to the etching effect can be fed to the surface of specimen 4. Thus, by constituting a system for feeding radicals 16, 16, from the radical generator 17 to the surface of specimen 4, as shown in FIG. 5, transmuted portion 26 is generated by irradiation of the convergence laser beams (LB₁) to $Al_2O_3$ oxidized film 24 formed by effect of spontaneous oxidization on the surface of aluminum film 23 to be etched. In other words, chemical etching can be executed against aluminum film 23 shown in FIGS. 3 and 4 simultaneous with the drawing of etching patterns. Like the etching process executed by the apparatus shown in FIG. 1, since aluminum film 23 is etched by chemical reaction generated between Cl radicals 16, 16, from reactive gas $BCl_3$, the lower layer semiconductor film 22b is not exposed to convergence laser beams containing substantial amount of energy. Consequently, the convergence laser beams do not directly hit semiconductor film 22b, and thus, no thermal damage is generated.

On the other hand, the radical generator 17 employs the method of dissociating reactive gas by applying beam energy generated by those luminous sources such as deuterium lamp irradiating ultraviolet beams or low-pressure mercury lamp for example and the method of disintegrating plasma by applying either discharge of microwaves having 2.45 GHz of frequency or discharge of radio-frequency waves having 13.56 MHz of frequency for example, respectively. In particular, when the radical generator 17 disintegrates plasma, in addition to radicals 16, 16, directly contributing to the etching of specimen 4, high-energy ion is excited. However, since high-energy ion merely has such a life shorter than that of radicals 16, 16, if the distance between the radical generator 17 and the specimen 4 is extended to 20 cm for example, high-energy ion having a relatively short life cannot reach the specimen 4. As a result, the surface of specimen 4 is not sputtered by ion energy, and thus, it remains free from incurring physical damage.

Figure 7:
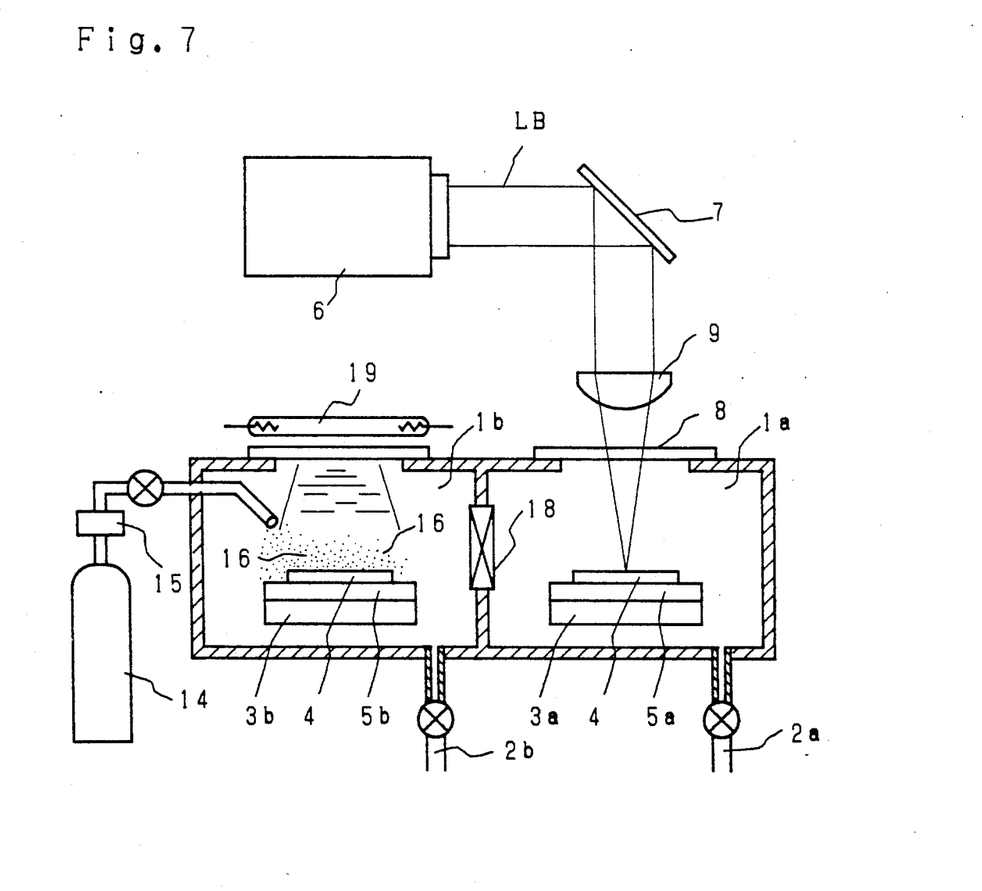

FIG. 7 denotes another apparatus for implementing the first preferred embodiment of the dry-etching method related to the invention. This apparatus features execution of the etching pattern drawing process against the oxidized film 24 using the convergence laser beams shown in FIG. 5 and the chemical etching process using radicals 16, 16, shown in FIGS. 3 and 4, while these processes are respectively and discretely implemented in the first and second reaction chambers 1a and 1b. More particularly, using the convergence laser beams, first, etching patterns are drawn on the specimen 4 secured to the first specimen holder 3a and the first heater 5a inside of the first reaction chamber 1a. Next, the specimen 4 is transferred to the second specimen holder 3b and the second heater 5b inside of the second reaction chamber 1b which contains less amount of atmospheric pressure decompressed to a maximum of $10^{31\ 3}$ Torr by vacuum means 2b via the opened shutter 18 and conveying means (not shown). A reserve chamber may be provided between the first and second reaction chambers 1a and 1b. Next, the shutter 18 is closed and reactive gas comprised of $BCl_3$ is fed into the reaction chamber 1b from gas cylinder 14.

Next, ultraviolet beams are irradiated from a luminous source 19 such as deuterium lamp or low-pressure mercury lamp to dissociate reactive gas before eventually generating radicals 16, 16, directly contributing to the etching of the specimen 4. Consequently, by effectively applying $Al_2O_3$ oxidized film 24 which serves as etching-resistant mask, those portions of aluminum film

23 transmuted during the etch-pattern drawing process are removed from specimen 4 by executing the etching process without incurring physical and thermal damage at all.

The above-cited preferred embodiment uses Cl radicals generated by photolysis of BCl$_3$. However, the scope of this preferred embodiment is not confined to the use of Cl radicals, but those radicals generated by photolysis of HCl, Cl$_2$, SiCl$_4$, or CCl$_4$, may also be used.

Figure 8:
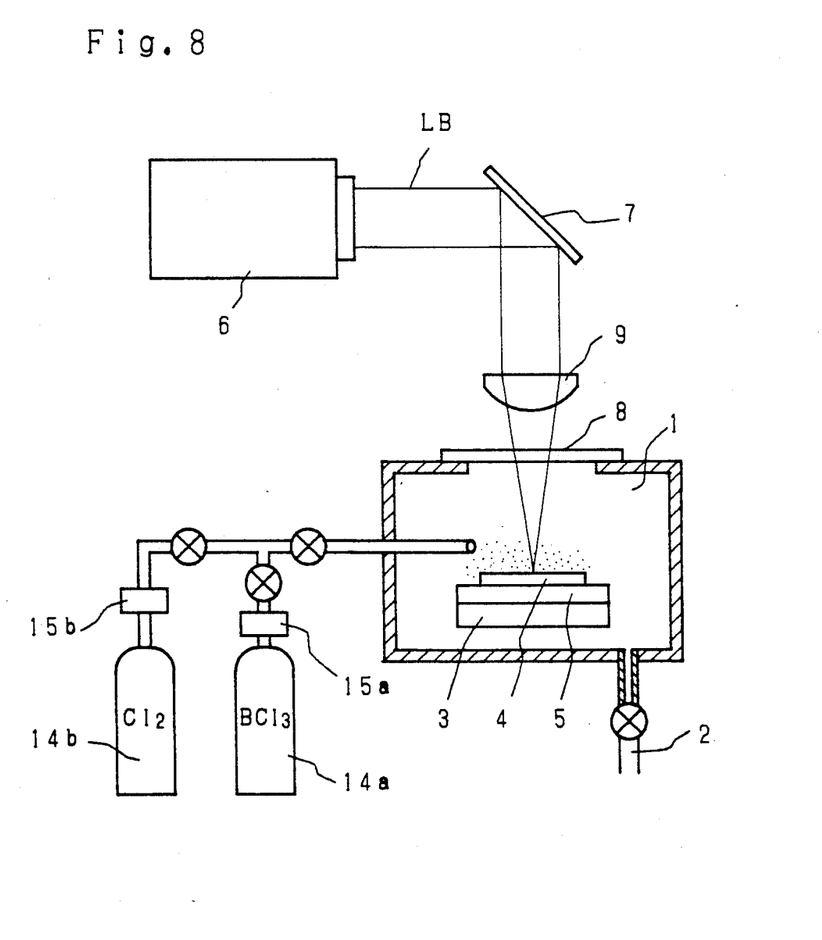
FIG. 8 is the schematic diagram of the apparatus embodying the second preferred embodiment of the dry-etching method related to the invention.

Next, the second preferred embodiment of the dry-etching process related to the invention, more particularly, a preferred embodiment for removing patterns of metallic film by using etching gas, if described below. FIG. 8 is the simplified schematic diagram of the etching apparatus implementing the second preferred embodiment. Description of those constituents shown in FIG. 8 having the reference numerals identical to those of FIG. 1 is omitted. The reaction chamber 1 of the apparatus shown in FIG. 8 is provided with the first gas cylinder 14a storing BCl$_3$ and the second gas cylinder 14b storing Cl$_2$ used for etching gas, while these gas cylinders are connected to each other via gas-flow controllers 15a and 15b, respectively. The apparatus shown in FIG. 8 is also provided with converging lens 9 which is movable in the forward and backward directions against the beam path. Accordingly, if the converging lens 9 is in the beam path, convergence laser beams (LB$_1$) are irradiated to the surface of specimen 4, whereas if the converging lens 9 is behind the beam path, non-convergence laser beams (LB$_2$) are irridiated to the surface of specimen 4.

Next, the second preferred embodiment of the dry-etching method related to the invention is described below. First, specimen 4 having such quality exactly indentical to that of the specimen used for the first preferred embodiment is secured to the specimen holder 3. Next, as a result of the scanning operation of the first mirror 7, the convergence laser beams (LB$_1$) is irradiated to the surface of the oxidized film 24 so that etching pattern can be drawn on it as is done for the first preferred embodiment.

Simultaneously, reactive gas composed of BCl$_3$ is fed into the reaction chamber 1 from the first gas cylinder 14a. When the internal pressure of the reaction chamber 1 is retained at 20 Torr, BCl$_3$ is dissociated by ultraviolet beams having 193 nm of wave length in accordance with reactions shown below.

$BCl_3 \rightarrow BCl_2 + Cl^*$ $BCl_2 \rightarrow BCl + Cl^*$

On the other hand, removal of oxidized film 24 is promoted by the reaction shown below.

$Al_2O_3 + 2BCl_3 \rightarrow 2AlCl_3 \uparrow + B_2O_3$

Accordingly, if BCl$_3$ is delivered to the reaction chamber 1 simultaneous with the irradiation of the convergence laser beams, compared to the drawing of etching patterns merely by irradiating the convergence laser beams, a large number of cracks 25 are generated by physical destruction. Since the removal of the transmuted portion 26 from the oxidized film 24 is chemically promoted, clear patterns can eventually be generated in contrast with aluminum film 23 to be etched.

Then, Cl$_2$ gas is fed into the reaction chamber 1 from the second gas cylinder 14b via mass-flow controller 15b which controls the flow rate of the Cl$_2$ gas. Cl$_2$ gas does not provide the oxidized film 24 with etching effect, but it conversely provides aluminum film 23 with sufficient etching effect. On the other hand, during the preceding process for drawing etching patterns on aluminum film 23 via irradiation of the convergence laser beams, the reaction chamber 1 already stores 20 Torr of BCl$_3$ gas for generating Cl radicals which provide aluminum film 23 with substantial etching effect in order to convert the transmuted portion 26 into fine patterns, and as a result, Cl$_2$ gas is fed into the reaction chamber 1 so that it can be mixed with BCl$_3$ gas. The Cl$_2$ gas is provided with 1 through 10 Torr of pressure for example against 20 Torr of the pressure provided for BCl$_3$ gas. Next, after heating the specimen 4 to about 50° C. with heater 5, the specimen 4 is exposed to the irradiation of non-convergence laser beams (LB$_2$) which is substantially comprised of ultraviolet laser beams having 193 nm of wave length emitted from the ArF excimer laser 6. In other words, by converting ultraviolet laser beams into non-convergence laser beams, these beams are provided with less energy density than that of the convergence laser beams used for generating transmuted portion 26, and as a result, irradiated range is effectively expanded. Since the irradiated non-convergence laser beams (LB$_2$) contain less energy density, no thermal (physical) treatment like annealing is applied to the specimen 4, and instead, the specimen 4 can safely be heated to 125° C. through 200° C. where the specimen 4 remains free from incurring thermal damage.

Thus, the surface of specimen 4, i.e., aluminum film 23 which bares itself via the transmuted portion 26 containing cracks of oxidized film 24, is exposed to gas environment containing mixture of Cl$_2$ and BCl$_3$, and as a result, due to complete chemical reactions generated by Cl$_2$ gas and Cl radicals (Cl*), aluminum film 23 is eventually etched. These chemical reactions are shown below.

$2Al + 3Cl_2 \rightarrow 2AlCl_3 \uparrow$ $Al + Cl^* \rightarrow AlCl$ $AlCl + Cl^* \rightarrow AlCl_2$ $AlCl_2 + Cl^* \rightarrow AlCl_3 \uparrow,$ The process for etching aluminum film 23 employed for the second preferred embodiment is identical to those which are shown in FIGS. 3 and 4. More particularly, first, a number of cracks are generated on the oxidized film 24 by irradiation of the convergence laser beams (LB$_1$), and then, mixture of Cl$_2$ and BCl$_3$ gas permeate the surface of aluminum film 23 to be etched through those cracks, Finally, only those portions of aluminum film 23 containing temperature raiesed by irradiation of low-energy non-convergence laser beams (LB$_2$) are selectively removed. The oxidized film 24 serves as etching-resistant mask. As shown in FIG. 3, when the selective etching of aluminum film 23 goes on, the bottom portion of the transmuted portion 26 of the oxidized film 24 containing a number of cracks in assembly becomes empty, and as a result, the transmuted portion 26 collapses itself while the etching process is underway. Aluminum film 23 is then split into power-generating regions A, B, as shown in FIG. 4, thus eventually generating back-surface electrodes 23a, 23b, which constitute photoelectric conversion films SC$_1$, SC$_2$, together with transparent electrodes 21a, 21b, and semiconductor films 22a, 22b, in the power-generating regions A, B.

Unlike the first preferred embodiment which etches aluminum film 23 with Cl radicals, the second preferred embodiments etches aluminum film 23 with etching gas comprised of $Cl_2$, thus effectively achieving the etching at a speed faster than that of the first preferred embodiment.

Figure 9:
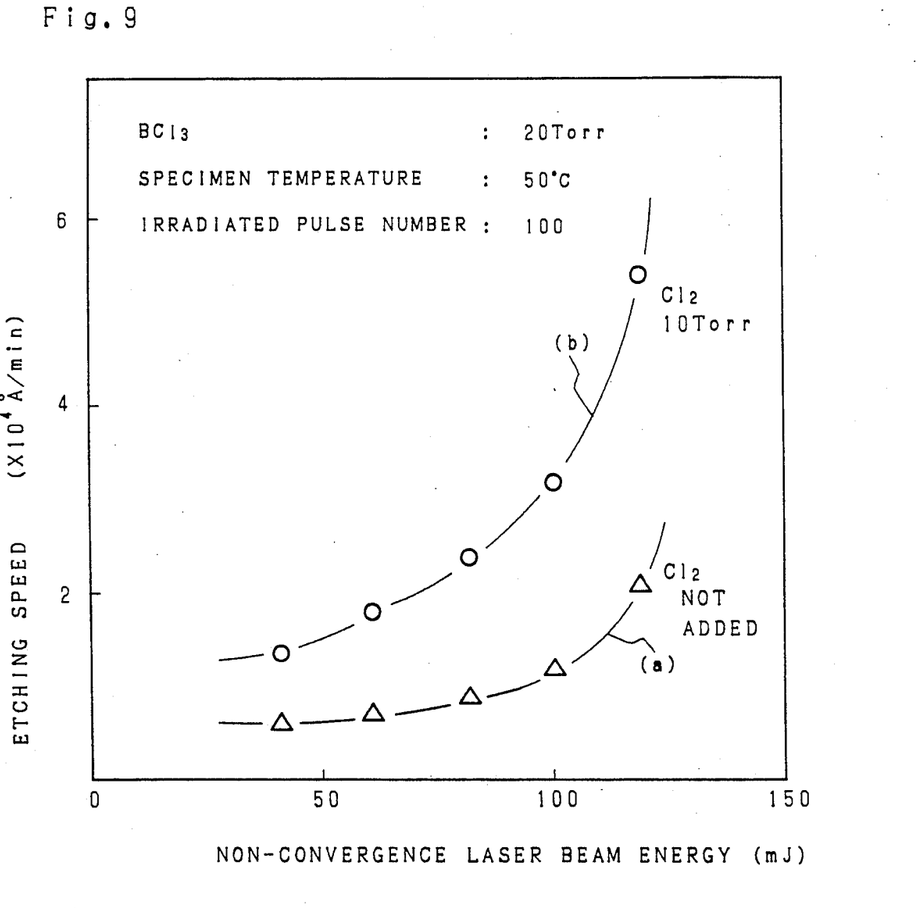
FIG. 9 is the graphical chart denoting the relation between the non-convergence laser beam energy and the speed of executing the etching process.

FIG. 9 is the graphical chart denoting the relation between the speed of executing the etching process and energy of non-convergence laser beams when these laser beams are irradiated against specimen 4 heated to 50° C. with 100 pulses of irradiated pulse munber in absence of $Cl_2$ gas (see FIG. 9-(a)) and in presence of $Cl_2$ gas mixed with $BCl_3$ gas containing 10 Torr of pressure (see FIG. 9-(b)) after completing irradiation of about 500 through 1,500 pulses of convergence laser beams emitted from ArF excimer laser (100 mJ) 6 against the surface of the oxidized film 24 in presence of $BCl_3$ gas containing 20 Torr of pressure, respectively. As is obvious from FIG. 9-(a) and (b), the speed of executing the etching process can be accelerated by application of $Cl_2$ gas.

Partial pressure of $Cl_2$ gas, grade of the photolysis of $BCl_3$ gas, and temperature of specimen 4 respectively constitute parameter which varies the speed of executing the etching process in the second preferred embodiment.

Figure 10:
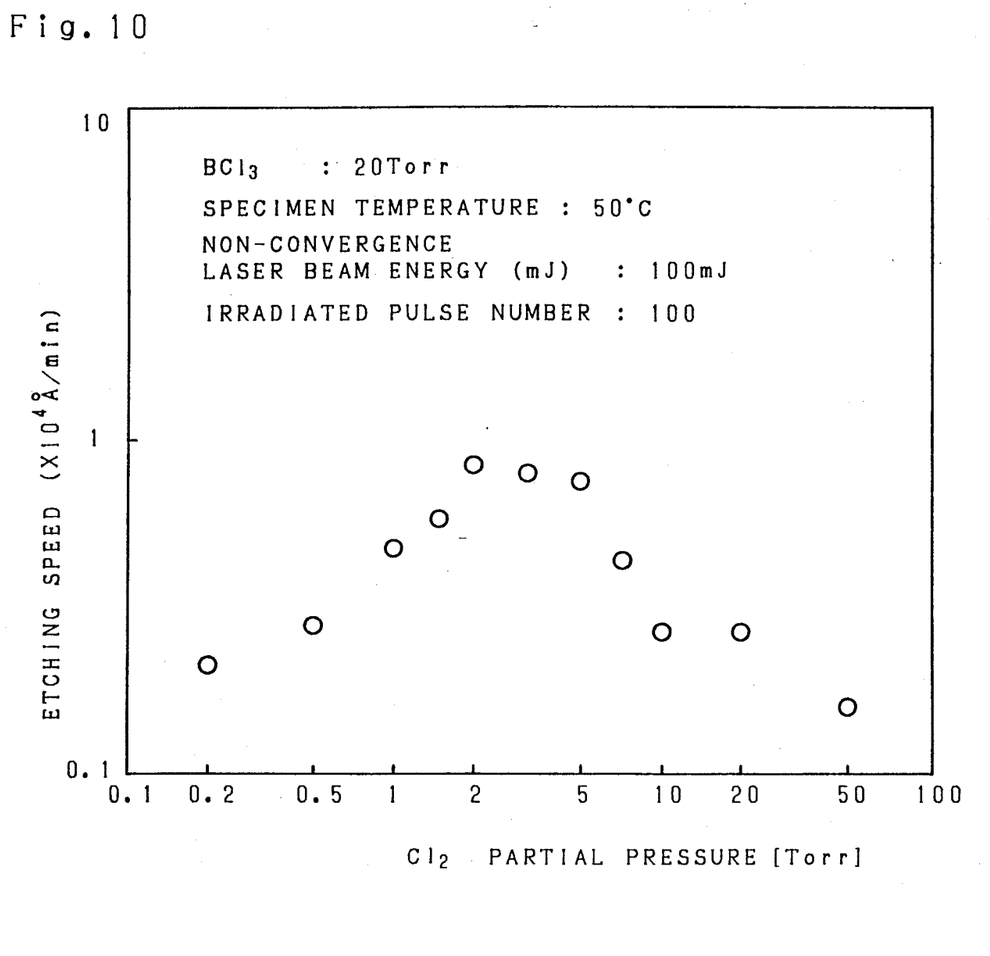
FIG. 10 is the graphical chart denoting the relation between the partial pressure of chlorine gas and the speed of executing the etching process.

FIG. 10 is the graphichal chart representing variation of the etching speed when varying the partial pressure of $Cl_2$ gas against the basic etching condition against specimen 4 heated at 50° C. by applying 100 mJ of the energy of non-convergence laser beams and 100 pulses of irradiated pulse number in presence of BCl gas containing 20 Torr of pressure. As is clear from FIG. 10, the etching speed reaches maximum when the partial pressure of $Cl_2$ gas is slightly more less than 2 Torr, thus allowing the etching process to effectively be implemented at an advantageous speed 10 times faster than that is done by applying $BCl_3$ gas alone. Concretely, the etching speed is securely accelerated when partial pressure of $Cl_2$ gas is 0.01 to 1.0 in relation to the actual pressure of $BCl_3$ gas, desirably it should be in the range of 0.05 to 0.25, more desirably, it should be in the range of 0.1 to 0.25.

Figure 11:
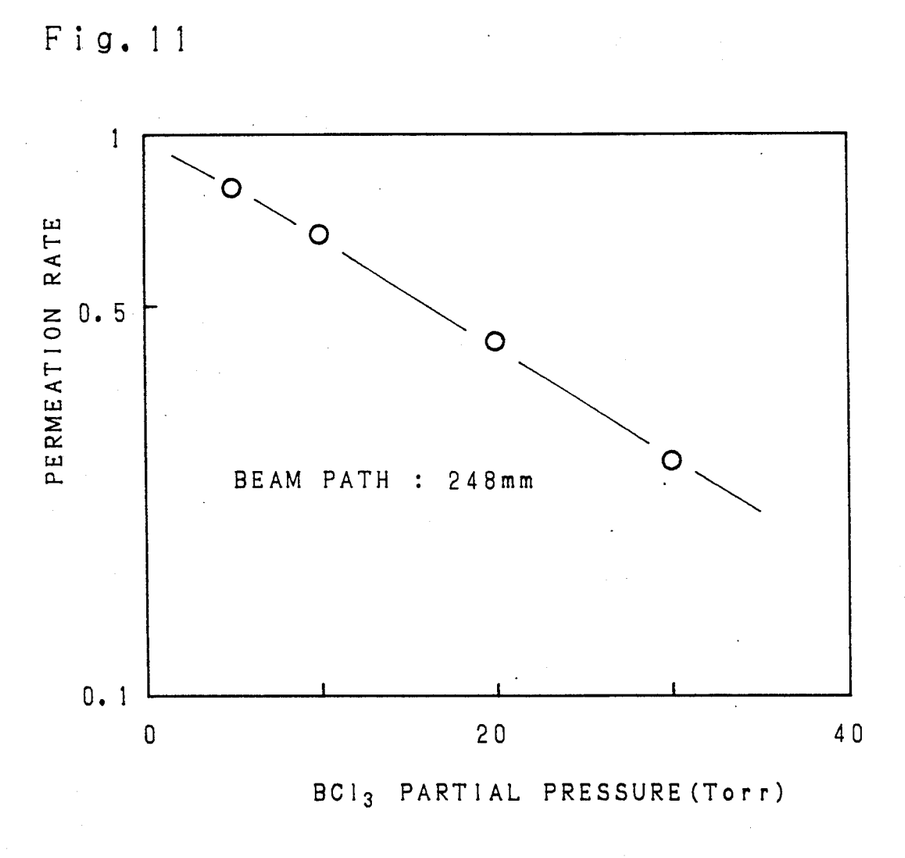
FIG. 11 is the graphical chart denoting the relation between the partial pressure of $BCl_3$ and the permeation rate.
Figure 12:
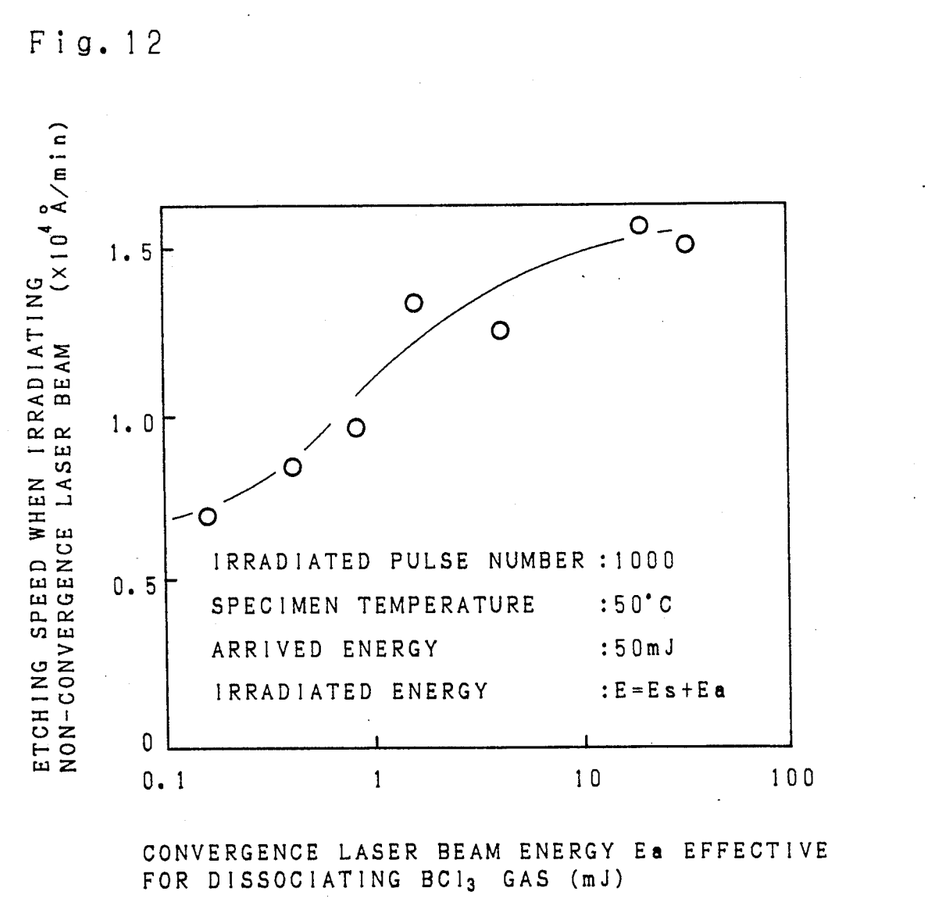
FIG. 12 is the graphical chart denoting the relation between the convergence laser beam energy effective for dissociating $BCl_3$ and the speed of executing the etching process.

FIG. 11 is the graphical chart denoting the beam absorbing characteristic of $BCl_3$ gas when the beam path is 248 mm. FIG. 12 is the graphical chart denoting the speed of executing the etching process when varying the partial pressure of $BCl_3$ gas while constantly controlling energy of the convergence laser beams needed for reaching the substrate. FIG. 12 concretely denotes the relation between energy Ea of the convergence laser beam absorbed by $BCl_3$ gas and dissociated $BCl_3$ gas and the etching speed when irradiating non-convergence laser beams. The etching process is executed against specimen heated at 50° C. in accordance with the basic condition including the use of 50 mJ of energy Es of laser beams and 1,000 pulses of the irradiated pulse number, where the irradiated energy E is denoted to be $E=Es+Ea$.

It is obvious from FIG. 12 that the speed of executing the etching process is accelerated when irradiating non-convergence laser beams relative to the development of photolysis of $BCl_3$ gas due to irradiationl of the convergence laser beams.

Figure 13:
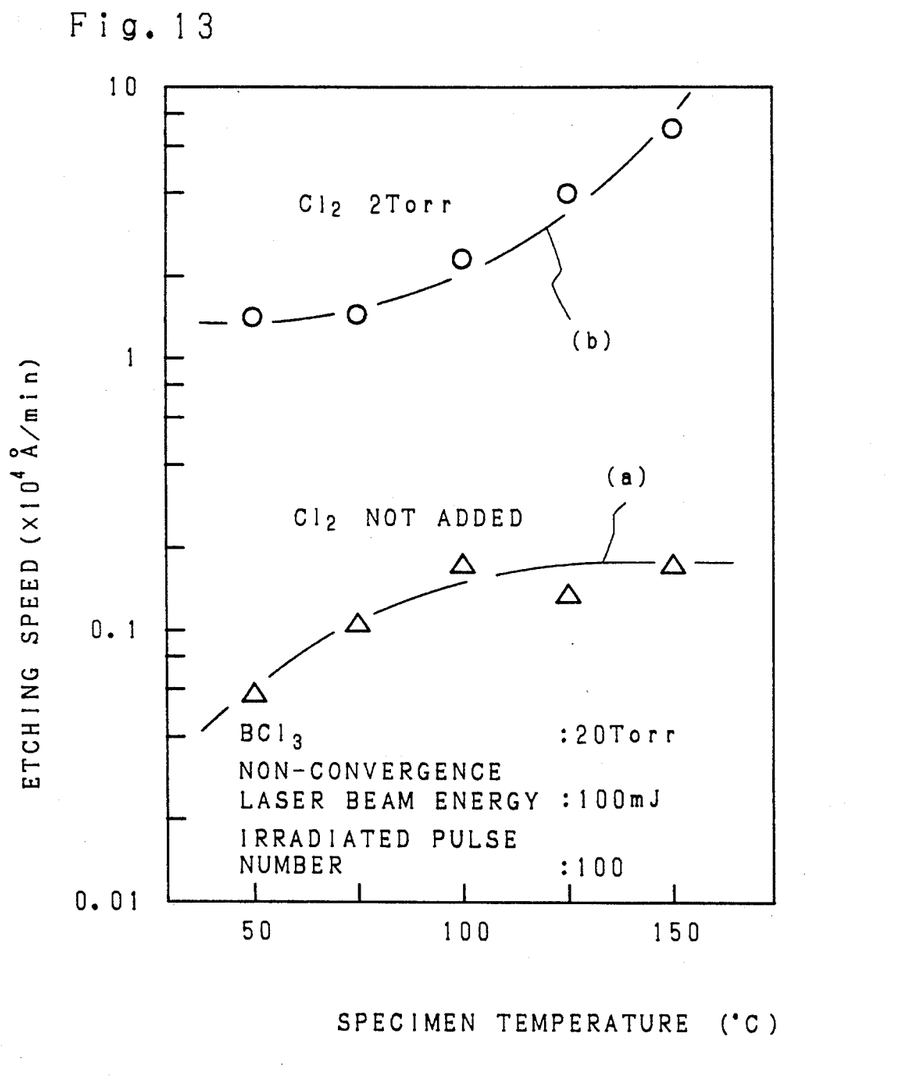
FIG. 13 is the graphical chart denoting the relation between the temperature of specimen and the speed of executing the etching process.

FIG. 13 is the graphical chart representing the relation between temperature of specimen and the etching speed under the basic condition in which temperature of specimen is at 50° C., $BCl_3$ gas contains 20 Torr of pressure, and non-convergence laser beams contain 100 mJ of energy and 100 pulses of irradiated pulse number, respectively. FIG. 13-(a) denotes the above relation when $Cl_2$ gas is absent and FIG. 13-(b) denotes the above relation when $Cl_2$ gas corresponding to 2 Torr of pressure is mixed with $BCl_3$ gas. Thus, it is clear from FIG. 13 that the etching speed is accelerated by applying $Cl_2$ gas for executing the etching process, and yet, a still faster speed can be achieved by heating the specimen above 50° C. when adding $Cl_2$ gas to $BCl_3$ gas together.

Figure 14:
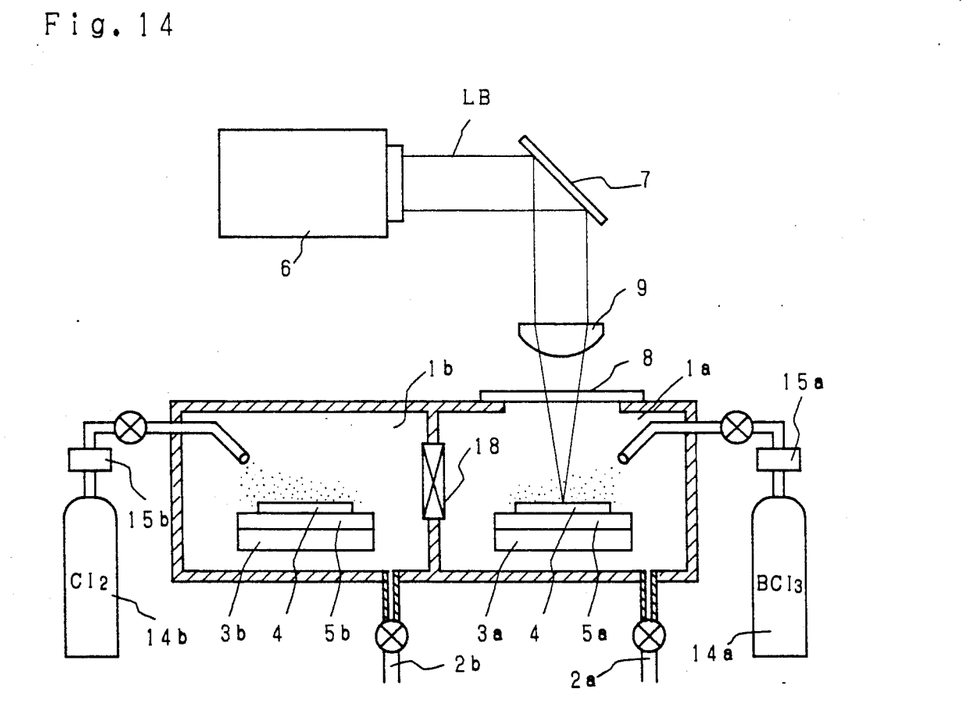
FIG. 14 is the schematic diagram of another apparatus used for embodying the second preferred embodiment of the dry-etching method related to the invention.

FIG. 14 is the schematic diagram of another apparatus for executing the second preferred embodiment of the dry-etching method related to the invention. Like the etching apparatus shown in FIG. 7, this apparatus executes the process for drawing etching patterns on the oxidized film 24 by irradiation of laser beams into the reaction chamber 1a, and in addition, this apparatus also executes the process for executing chemical etching aluminum film 23 by exposing it to $Cl_2$ gas in the reaction cahmber 1b. Note that those constituents and functions of the apparatus shown in FIG. 14 are identical to those which are shown in FIG. 7 or 8, where all the corresponding constituents are provided with identical reference numerals, and thus, description of these is omitted.

The foregoing descriptions in conjunction with the first and second preferred embodiments have respectively referred to the method of patterning aluminum of film. It should be understood, however, that the patterning can also be achieved for other metallic films if oxidized film can be generated on the surface not only be spontaneous generation, but also under an intentional oxidizing process as well. It is conventionally known that, in order to promote beam reflection rate, a variety of oxidized films can be used for constituting back-surface electrodes of solar cells, which typically include combined layers of silver layer and aluminum layer, combined layers of beam-permeable conductive oxide (TCO layer) comprised of ITO or $SnO_2$, silver layer and aluminum layer, and the combined layers of TCO layer, silver layer, and titanium layer, or like. Even when patterning these films cited above, the dry-etching method embodied by invention can effectively be applied by adequately selecting luminous sources capable of sufficiently irradiating wave length enough to activate or dissociate either the reactive or etching gas ingredients or other energy sources capable of satisfying the above requirements.

As described above, in order to draw etching patterns on the oxidized film, the first and second preferred embodiments respectively generate transmuted portion 26 comprised of a number of assembled cracks 25 formed on the oxidized film 24 by applying pulse-output type ArF excimer laser 6. However, the dry-etching method related to the invention also allows drawing of etching patterns not only by means of the ArF excimer laser 6 cited above, but also by applying those high-energy beams generated by other pulse-output type lasers such as YAG laser which outputs 1.06 μm, Nd of wave length, the secondary harmonic beam of YAG laser, KrF excimer laser, XeCl excimer laser, or metallic vapor laser, other continuous-output type lasers, high energy beams such as ion beams, or electron beams. If energy beams can extensively be irradiated while maintaining sufficient amount of energy, then the etching patterns may also be drawn by means of projection using transfer mask. Furthermore, etching patterns may be generated not only by formation of transmuted portion 26, but these patterns may also generated merely by removing the oxidized film 24.

The etching pattern formed by the second preferred embodiment may also remain in the state of being transmuted by a large number of assembled cracks 25 which are generated merely by irradiation of energy beams without causing the surface of etched patterns to be exposed to radicals.

It is also possible for the dry-etching method related to the invention to employ the method of irradiating non-convergence laser beams available for selectively etching patterns to be drawn through a converging lens by damping energy of these laser beams.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A dry-etching method for patterning a metallic film on a substrate, the metallic surface being provided with an oxidized film, into a desired configuration, comprising the steps of:
    transforming an area of said oxidized film into a transmuted portion with physical cracks that extend through said oxidized film to said metallic film by irradiating with a convergence laser beam the area of said oxidized film according to an etching pattern, said oxidized film being exposed to an atmosphere of a reactive gas reactive for transforming the area of the oxidized film which is irradiated with the laser beam; and
    thereafter exposing said metallic film through said physical cracks to an atmosphere of an activated etching gas, said activated etching gas being activated by a non-convergence laser beam and effecting a complete chemical reaction with said metallic film to form a gaseous reaction end product, the step of thereafter exposing including selectively etching and removing the area of said metallic film in correspondence to said area of said oxidized film that was irradiated by said convergence laser beam, said oxidized film being resistant to removal from exposure to said activated etching gas whereby said transmuted portion collapses as a result of the step of thereafter exposing.

2. The dry-etching method in accordance with claim 1, wherein said oxidized film is formed by spontaneous oxidation in an oxidizing atmosphere.

3. The dry-etching method in accordance with claim 1, wherein said oxidized film is generated by applying oxidizing treatment to the surface of said metallic film.

4. The dry-etching method in accordance with claim 1, wherein said metallic film is substantially comprised of either a single layer of aluminum film or multiple layer film at least the surface of which is provided with an aluminum film.

5. The dry-etching method in accordance with claim 1, wherein said etching gas is selected from a group consisting of $Cl_2$, $BCl_3$, $HCl$, $SiCl_4$, and $CCl_4$.

6. The dry-etching method in accordance with claim 1, wherein said laser beams are substantially comprised of pulse-output type energy beams.

7. The dry-etching method in accordance with claim 1, wherein said laser beams are selected from a group consisting of excimer laser beam, ion beam, electron beam, YAG laser beam, secondary harmonic beam of YAG laser, and metallic vapor laser beam.

8. The dry-etching method in accordance with claim 7, wherein said laser beams are substantially comprised of excimer laser beams and said laser beam which is irradiated to said oxidized film is of sheet configuration.

9. The dry-etching method in accordance with claim 7, wherein said laser beams are substantially comprised of metallic vapor laser beams and said laser beam which is irradiated to said oxidized film is of sheet configuration.

10. The dry-etching method in accordance with claim 1, wherein the process for irradiating laser beams to said oxidized film and the process for thereafter exposing said metallic film are executed in separate chambers.

11. The dry-etching method in accordance with claim 1, wherein the reactive gas used in the step of transforming is an etching gas which assists in transforming the area of said oxidized film into said transmuted portion as the area is being irradiated with the convergence laser beam.

12. A dry-etching method for patterning a metallic film on a substrate into a desired configuration, comprising the steps of:
    forming an oxide film on a surface of said metallic film;
    transforming an area of the oxide film into a transmuted portion with physical cracks that extend through said oxide film to the metallic film by irradiating with a first convergence laser beam the area of said oxide film according to an etching pattern, the step of transforming taking place within an atmosphere of a reactive gas reactive for transforming the area of the oxide film which is irradiated with the laser beam;
    activating the reactive gas to generate radicals by irradiating said reactive gas with a second non-convergence laser beam less condensed than said first laser beam; and
    thereafter exposing said metallic film to the radicals of the activated reactive gas, the radicals effecting a complete chemical reaction with said metallic film to form a gaseous reaction end product, the step of thereafter exposing including selectively etching and removing the area of said metallic film in correspondence to said area of the oxide film, said oxide film being resistant to removal from exposure to said radicals whereby said transmuted portion collapses as a result of the step of thereafter exposing.

13. A method as in claim 12, wherein the step of forming takes place spontaneously in air at room temperature.

14. A method as in claim 12, wherein said metallic film is aluminum film and said oxide film is aluminum oxide film.

15. The dry-etching method in accordance with claim 1, wherein said radicals are substantially comprised of Cl radicals.

16. The dry-etching method in accordance with claim 1, wherein temperature of said metallic film exposed to radicals of said reactive gas is raised above room temperature.

* * * * *